United States Patent [19]

Kusuda et al.

[11] Patent Number: 4,957,850
[45] Date of Patent: Sep. 18, 1990

[54] PHOTOSENSITIVE FLEXOGRAPHIC RESIN PLATE

[75] Inventors: Hidefumi Kusuda, Takatsuki; Katsuji Konishi, Ibaraki; Kazunori Kanda, Yao, all of Japan

[73] Assignee: Nippon Paint Co., Ltd., Osaka, Japan

[21] Appl. No.: 478,562

[22] Filed: Feb. 12, 1990

Related U.S. Application Data

[63] Continuation of Ser. No. 344,504, Apr. 27, 1989, abandoned, which is a continuation of Ser. No. 67,121, Jun. 29, 1987, abandoned.

[30] Foreign Application Priority Data

Jun. 27, 1986 [JP] Japan .................. 61-152009

[51] Int. Cl.⁵ .................................................. G03C 1/76
[52] U.S. Cl. .................................... 430/271; 430/273; 430/281; 430/275; 430/300; 430/306
[58] Field of Search ............... 430/281, 286, 300, 306, 430/271, 275

[56] References Cited

U.S. PATENT DOCUMENTS

| | | | |
|---|---|---|---|
| 3,148,064 | 9/1964 | Rauner et al. | |
| 4,177,074 | 12/1979 | Proskow | 430/286 |
| 4,251,618 | 2/1981 | McCartin et al. | 430/286 |
| 4,330,612 | 5/1982 | Tashiro et al. | 430/286 |
| 4,369,246 | 1/1983 | Chen et al. | 430/300 |
| 4,400,459 | 8/1983 | Gruetzmacher | 430/286 |
| 4,400,460 | 8/1983 | Fickes et al. | 430/286 |
| 4,414,278 | 11/1983 | Cohen et al. | |
| 4,415,649 | 11/1983 | Munger et al. | 430/286 |
| 4,478,931 | 10/1984 | Fickes et al. | 430/302 |
| 4,518,472 | 5/1985 | Kishida et al. | |

FOREIGN PATENT DOCUMENTS

| | | |
|---|---|---|
| 0041643A2 | 12/1981 | European Pat. Off. |
| 0092783A3 | 11/1983 | European Pat. Off. |
| 0188232A3 | 7/1986 | European Pat. Off. |

*Primary Examiner*—Jack P. Brammer
*Attorney, Agent, or Firm*—Wenderoth, Lind & Ponack

[57] ABSTRACT

Disclosed is a photosensitive flexographic resin plate having excellent wear resistance and giving relief image faithful to a negative film. The photosensitive flexographic printing plate is composed of a base plate and a photosensitive resin layer thereon wherein said photosensitive resin layer is formed from a resin composition comprising a resin having rubber elasticity, an unsaturated monomer, a photopolymerization initiator and resin particles having an average particle size of about 0.01 to 6 micron, and when said photosensitive resin layer is cured, the cured layer has a JIS A hardness of 30° to 80° and an impact resilience of at least 20%.

8 Claims, No Drawings

PHOTOSENSITIVE FLEXOGRAPHIC RESIN PLATE

This application is a continuation of now abandoned application, Ser. No. 07/344,504 filed on Apr. 27, 1989 which is a continuation of now abandoned application Ser. No. 07/067,121 filed June 29, 1987.

FIELD OF THE INVENTION

The present invention relates to a photosensitive flexographic resin plate having improved mechanical strength without adversely affecting on duplicativity, hardness and resilience of a relief image.

BACKGROUND OF THE INVENTION

A photosensitive flexographic resin plate is usually prepared from a composition containing a resin having rubber elasticity, an addition-polymerizable unsaturated monomer and a photopolymerization initiator. The photosensitive flexographic resin plate, when cured, is required to have a suitable hardness (JIS A Hardness: 30° to 80°) and impact resilience of more than 20%.

In many cases, the requirement is satisfied by adding a softening agent or plasticizer. However, the addition of such an agent adversely affects mechanical strength to result in the crack of the printing plate and the imperfection of relief image. The printing plate containing a softening agent or plasticizer, therefore, is not good for industrial usage and is only for a limited usage.

In order to improve the above-mentioned defect, it is proposed to add a filler, such as silica, extender, glass fiber and the like. However, since the filler is different from a base resin in refractive index, particle distribution, composition and the like, it adversely affects the duplicativity of relief image because of the dispersion of irradiated light.

SUMMARY OF THE INVENTION

The present invention provides a photosensitive flexographic resin plate not having the above defects. The photosensitive flexographic resin plate is composed of a base plate and a photosensitive resin layer thereon wherein said photosensitive resin layer is formed from a resin composition comprising a resin having rubber elasticity, an unsaturated monomer, a photopolymerization initiator and resin particles having an average particle size of about 0.01 to 6 micron, and when said photosensitive resin layer is cured, the cured layer has a JIS A hardness of 30° to 80° and an impact resilience of at least 20%.

DETAILED DESCRIPTION OF THE INVENTION

The present invention is characterized by adding the resin particles having a particle size of about 0.01 to 6 micron to a photosensitive resin composition. The resin particles can be prepared by any methods known in the art. Representative are a method comprising suspension- or emulsion-polymerizing an ethylenically unsaturated monomer with a crosslinkable copolymerizable monomer in an aqueous medium to form a resin particle dispersion and then removing water by solvent substitution, azeotropic distillation, centrifugation or drying to form micro resin particles; an NAD method or precipitation-separation method in which an ethylenically unsaturated monomer is copolymerized with a crosslinkable monomer in a nonaqueous solvent not dissolving a polymer but a monomer, including a low SP organic solvent, such as an aliphatic hydrocarbon and the like, or a high SP organic solvent such as an ester, a ketone or an alcohol; a method employing a water-soluble resin having amphoteric ion groups as disclosed in Japanese Patent Publication (unexamined) No. 129066/1983; and the like.

From the viewpoints of miscibility, reaction stability, storage stability and the like, it is preferred that the resin particles have an average particle size of about 0.01 to 6 microns, preferably 0.05 to 0.5 micron. Average particle sizes less than 0.01 micron provide a lack of wear resistance and adversely affect the human body because of scattering of the particles. The average particle sizes of more than 6 microns reduce printed image quality.

Examples of the ethylenically unsaturated monomers are an alkyl ester of (meth)acrylic acid, such as methyl (meth)acrylate, ethyl (meth)acrylate, n-butyl (meth)acrylate, iso-butyl (meth)acrylate, 2-ethylhexyl (meth)acrylate and the like; styrene; alpha-methylstyrene, vinyltoluene; t-butylstyrene; ethylene; propylene; vinyl acetate; vinyl propionate; acrylonitrile; methacrylonitrile; dimethylaminoethyl (meth)acrylate and a mixture thereof.

The crosslinkable copolymerizable monomer includes a monomer having at least two radical-polymerizable ethylenically unsaturations in one molecule and/or ethylenically unsaturated monomers having a functional group reaction with each other. The former generally contains an ester of a polyhydric alcohol with an unsaturated monocarboxylic acid, and an ester of a polybasic acid with an unsaturated alcohol, and an aromatic compound substituted with at least two vinyl groups. Examples of the former are ethylene glycol diacrylate, ethylene glycol dimethacrylate, triethylene glycol dimethacrylate, tetraethylene glycol dimethacrylate, 1,3-butylene glycol dimethacrylate, trimethylolpropane triacrylate, trimethylolpropane trimethacrylate, 1,4-butanediol diacrylate, neopentyl glycol diacrylate, 1,6-hexanediol diacrylate, pentaerythritol diacrylate, pentaerythritol triacrylate, pentaerythritol tetraacrylate, pentaerythritol dimethacrylate, pentaerythritol trimethacrylate, pentaerythritol tetramethacrylate, glycerol dimethacrylate, glycerol diacrylate, glycerol allyloxy dimethacrylate, 1,1,1-trishydroxymethylethane diacrylate, 1,1,1-trishydroxymethylethane triacrylate, 1,1,1-trishydroxymethylethane dimethacrylate, 1,1,1-trishydroxymethylethane trimethacrylate, 1,1,1-trishydroxymethylpropane diacrylate, 1,1,1-trishydroxymethylpropane triacrylate, 1,1,1-trishydroxymethylpropane dimethacrylate, 1,1,1-trishydroxymethylpropane trimethacrylate, triallyl cyanurate, triallyl trimellitate, diallyl terephthalate, diallyl phthalate and divinylbenzene. Representative example of the latter is a combination of an epoxy group-containing unsaturated monomer such as glycidyl acrylate or glycidyl methacrylate and a carboxyl group-containing unsaturated monomer such as acrylic acid, methacrylic acid, crotonic acid and the like. The functional groups reactive with each other can be an amino and carbonyl group, an epoxide and carboxyl anhydride, an amino and carboxyl anhydride, an alkyleneimine and carbonyl, an organoalkoxysilane and carboxyl group, a hydroxyl and isocyanate group, and the like.

The resin particles thus produced can be separated from the aqueous or nonaqueous medium by filtration, spray drying, freeze drying and the like. The separated particle can be added neat or after further grinding to a suitable size by a mill to the photosensitive resin composition. The resin particles dispersion formed by replacing solvent is also used in the production.

It is desirable that the particle size be generally controlled by a polymerization method to be adopted. The emulsion or NAD process is preferred for 0.01 to 0.6 micron particles, the precipitation-separation process is for 0.2 to 2.0 micron particles and the suspension process is for 1 to 6 micron particles. Physical properties of the resin particles, such as glass transition temperature, solubility parameter and refractive index, can be controlled by the components to be formulated. The resin particles can have functional groups reactive with the matrix resin or unsaturated group on their surface so as to enhance mutual action between the resin particle matrixes. The particles may also contain a sensitizer for high energy beam curing, a promotor for activating reaction, a functional material imparting some function to the cured photosensitive resin composition.

The photosensitive flexographic resin plate may contain the resin particles in an amount of about 0.1 to 50 by weight, preferably 0.5 to 20% by weight based on solid contents of the photosensitive resin composition. The amounts less than 0.1% by weight do not impart improved wear resistance. Amounts of more than 50% by weight reduce physical properties of the flexographic printing plate such as impact resilience, hardness and the like.

In addition to the resin particles, the photosensitive flexographic resin plate of the present invention generally contains a resin having rubber elasticity, a photopolymerizable unsaturated monomer and a photopolymerization initiator. A polymerization inhibitor, a photosensitizer, a plasticizer and the like may also be formulated into the resin composition.

The resin having rubber elasticity can be a polymer which has a glass transition temperature of not more than $-10°$ C. and is solid at room temperature. When the glass transition temperature is more than $-10°$ C., the photosensitive flexographic resin plate has a decreased rubber elasticity, thus increasing hardness of the plate. Examples of the resins having rubber elasticity are butadiene polymer, isoprene polymer, chloroprene polymer, butadiene-styrene copolymer, styrene-butadiene-styrene block copolymer, styrene-isoprene-styrene block copolymer, butadiene-(meth)acrylic acid-acrylic ester compolymer, butadiene-(meth)acrylic acid-styrene copolymer, butadiene(meth)acrylic acid-acrylonitrile copolymer and the like. The content of the resin is not limited, but generally about 20 to 95% by weight, preferably 50 to 80% by weight based on the photosensitive resin composition.

Examples of the polymerizable unsaturated monomers are styrene, vinyltoluene, chlorostyrene, t-butylstyrene, alpha-methylstyrene, divinylbenzene, acrylic acid, methacrylic acid, methyl (meth)acrylate, ethyl (meth)acrylate, n-propyl (meth)acrylate, iso-propyl (meth)acrylate, n-butyl (meth)acrylate, iso-butyl (meth)acrylate, sec-butyl (meth)acrylate, t-butyl (meth)acrylate, 2-ethylhexyl (meth)acrylate, n-nonyl (meth)acrylate, n-decyl (meth)acrylate, lauryl (meth)acrylate, n-tridecyl (meth)acrylate, stearyl (meth)acrylate, ethylene glycol mono(meth)acrylate, propylene glycol mono(meth)acrylate, diethylene glycol mono(meth)acrylate, dipropylene glycol mono(meth)acrylate, a polyethylene glycol mono(meth)acrylate having a molecular weight of 200 to 1,000, a polypropylene glycol mono(meth)acrylate having a molecular weight of 200 to 1,000, a polyethylene glycol monomethyl ether mono(meth)acrylate having a molecular weight of 200 to 1,000, a polypropylene glycol monomethyl ether mono(meth)acrylate having a moleculare weight of 200 to 1,000, a polyethylene glycol monoethyl ether mono(-meth)acrylate having 200 to 1,000, a polypropylene glycol monoethyl ether mono(meth)arylate having a molecular weight of 200 to 1,000, n-butoxyethyl (meth)acrylate, phenoxyethyl (meth)acrylate, 2-phenoxypropyl (meth)acrylate, cyclohexyl (meth)acrylate, tetrahydrofurfuryl (meth)acrylate, glycidyl (meth)acrylate, ally (meth)acrylate, benzyl (meth)acrylate, tribromophenyl (meth)acrylate, 2,3-dichloropropyl (meth)acrylate, 3-chloro-2-hydroxypropyl (meth)acrylate, N,N-diethylaminoethyl (meth)acrylate, N,N-dimethylaminoethyl (meth)acrylate, N-t-butylaminoethyl (meth)acrylate, acrylamide, N,N-dimethyl acrylamide, N,N-diethylacrylamide, ethylene glycol di(meth)acrylate, propylene glycol di(meth)acrylate, 1,3-propanediol di(meth)acrylate, 1,4-butandiol di(meth)acrylate, neopentyl glycol di(meth)acrylate, 1,6-hexanediol di(meth)acryalte, polyethylene glycol di(meth)acrylate, polypropylene glycol di(meth)acrylate, glycerol di(meth)acrylate, glycerol tri(meth)acrylate, trimethylolpropane tri(meth)acrylate, trimethylolethane tri(meth)acrylate, ethylene bis-acrylamide, diallyl phthalate, triallyl cyanurate, diethyl fumarate, dibutyl fumarate, vinyl acetate and the like. The content of the unsaturated monomer is not limited, but generally about 1 to 80% by weight, preferably 3 to 60% by weight based on the solid content of the photosensitive resin composition.

Examples of the photopolymerization initiator are acetophenone, benzophenone and a derivative thereof; alphacarbonyl alcohol such as benzoin, acetoin and the like; acyloin ethers such as benzoin ethyl ether, benzoin isopropyl ether and the like; alpha-carbonyl ketals such as benzoin methyl ketal and the like; polyketones such as benzil and the like; polynuclear quinones such as 9,10-anthraquinone; mercaptans; disulfides; and the like. The amount of the photopolymerization initiator generally is about 0.01 to 10% by weight based on the photosensitive resin composition.

Examples of the polymerization inhibitors are hydroquinone, methylhydroquinone, methoxyphenol, N-nitrosodiphenylamine and the like. The amount of the inhibitor generally is bout 0.001 to 1.0% by weight based on the photosensitive resin composition.

Examples of the plasticizers are dialkyl phthalates such as dibutyl phthalate, dihexyl phthalate, di-2-ethylhexyl phthalate, diisodecyl phthalate and the like; dialkyl adipates such as di-2-ethylhexyl adipate, dioctyl adipate, diisodecyl adipate and the like; trialkyl trimellitates such as trioctyl trimellitate, triisodecyl trimellitate and the like; alkyl vinyl ethers such as acetyl vinyl ether, lauryl vinyl ether, stearyl vinyl ether and the like; polyethylene glycol phenyl ether; polypropylene glycol phenyl ether and the like. The amount of the plasticizer is not limited, but generally about 1 to 70% by weight, preferably 3 to 50% by weight.

The photosensitive flexographic resin plate of the present invention can be prepared by mixing the above mentioned components using a conventional mixer, such as a press kneader, a planetary mixer, a twin roll, a three roll, a hot roll and the like, and then forming a photosensitive resin layer on a base plate made from iron, aluminum, polyethylene terephthalate by using a calender.

A negative film is attached on the surface of the photosensitive flexographic resin plate of the present invention and exposed to ultraviolet beams to form a relief image. The relief image has a JIS A hardness of 30° to 80°, preferably 50° to 80° and has an impact resilience of at least 20%, preferably 20 to 50%. The hardness and impact resilience of the cured relief image can easily adjusted by a conventional method by adding the resin particles.

EXAMPLE

The present invention is illustrated by the following examples, which, however, are not to be construed as limiting the present invention to their details. "Part" and "%" in the examples should be based on weight unless otherwise instructed.

EXAMPLE 1

(1) Preparation of an emulsifying agent having amphoteric groups

A two liter flask equipped with a mixer, an introducing tube for nitrogen, a temperature controlling device, a condenser and a decanter was charged with 134 parts of bishydroxyethyltaurine, 130 parts of neopentyl glycol, 236 parts of azelaic acid, 186 parts of phthalic anhydride and 27 parts of xylene and heated to 96° C. to azeotropically remove reaction water and xylene. After starting reflux, the reaction mixture was heated to 190° C. over 2 hours and maintained at that temperature until acid value is 145. The reaction mixture was then cooled to 140° C. and 314 parts of Cardura E10 (a glycidyl ester of versatic acid; available from Shell Chemical Company) was added dropwise over 30 minutes. Mixing was continued for 2 hours to obtain a polyester resin. The polyester resin had an acid value of 59, a hydroxyl value 90 and Mn 1,054.

(2) Preparation of resin particles

A one liter reaction vessel having a mixer, a condenser and a temperature controlling device was charged with 490.4 parts of deionized water, 30 parts of the emulsifying agent obtained in (1) and 3 parts of dimethylethanolamine and heated to 80° C. At 80° C., a solution containing 2 parts of azobisisocyanovaleric acid, 40 parts of deionized water and 1.28 parts by weight of dimethylethanolamine, and another mixture of 120 parts of methyl methacrylate, 40 parts of ethylene glycol dimethacrylate and 40 parts of n-butyl acrylate were added dropwise over 60 minutes and mixed for 60 minutes to form a aqueous dispersion of resin particles (nonvolatile content 31%, average particle size 0.1 micron). The aqueous dispersion was freeze dried to obtain the resin particles powder.

(3) Preparation of a photosensitive flexographic resin plate

Sixty parts of a copolymer having a transition temperature (Tg) of −30° C. (the copolymer was prepared from 42% of ethyl acrylate, 9% of methacrylic acid, 35% of butadiene, 10% of dicyclopentynyl acrylate and 4% of ethylene glycol dimethacrylate), 4.9 parts of dimethylaminopropyl acrylamide, 5 parts of phenoxyethanol, 10.55 parts of dipropylene glycol monomethyl monoacrylate, 5 parts of trimethylolpropane trimethacrylate, 12.1 parts of Kayarad HX-620 available from Nippon Kayaku Co., Ltd., 1 part of stearic acid, 1.1 part of 2,2-dimethoxy-2-phenylacetophenone, 0.32 parts of 2,6-di-tert-butyl-p-cresol, 0.03 parts of methoquinone and 3 parts of the resin particles prepared in the above (2) were mixed by a press kneader. The obtained mixture was calendered on an iron plate having 0.18 mm at about 80° C. in a thickness of 0.5 mm to form a transparent photosensitive resin plate.

A negative film was vacuum attached to the surface of the photosensitive resin plate and exposed with a chemical lamp (350 W) for one minute at a distance of 6 cm. After removing the negative film, the plate was brushed by a nylon brush in water of about 40° C. to obtain a flexographic resin plate having a relief image faithful to the negative film. The properties of the flexographic resin plate are shown in Table 1.

EXAMPLE 2

(1) Preparation of resin particles

A one liter reaction vessel having a mixer, a condenser and a temperature controlling device was charged with 490.4 parts of deionized water, 30 parts of the emulsifying agent obtained in (1) of Example 1 and 3 parts of dimethylethanolamine and heated to 80° C. At 80° C., a solution containing 2 parts of azobisisocyanovaleric acid, 40 parts of deionized water and 1.28 parts by weight of dimethylethanolamine, and another mixture of 120 parts of methyl methacrylate, 40 parts of ethylene glycol dimethacrylate, 37.4 parts of n-butyl acrylate and 2.0 parts of dimethylaminopropyl methacrylamide were added dropwise over 60 minutes and mixed for 60 minutes to form a aqueous dispersion of resin particles (nonvolatile content 31%, average particle size 0.13 micron). The aqueous dispersion was freeze dried to obtain the resin particles powder.

(2) Preparation of a photosensitive flexographic printing plate

A flexographic resin plate faithful to a negative film was obtained as generally described in Example 1 with the exception that the resin particles obtained the above (1) was employed instead of the resin particles of Example 1 (1). The properties of the obtained flexographic resin plate are shown in Table 1.

EXAMPLE 3

(1) Preparation of resin particles

A one liter reaction vessel having a mixer, a condenser and a temperature controlling device was charged with 490.4 parts of deionized water, 30 parts of the emulsifying agent obtained in (1) of Example 1 and 3 parts of dimethylethanolamine and heated to 80° C. At 80° C., a solution containing 2 parts of azobisisocyanovaleric acid, 40 parts of deionized water and 1.28 parts by weight of dimethylethanolamine, and another mixture of 120 parts of methyl methacrylate, 40 parts of ethylene glycol dimethacrylate, 38.6 parts of n-butyl acrylate, 1.4 parts of methacrylic acid and 1.4 parts of dimethylethanolamine were added dropwise over 60 minutes and mixed for 60 minutes to for a aqueous dispersion of resin particles (nonvolatile content 31%, average particle size 0.15 micron). The aqueous dispersion was freeze dried to obtain the resin particles powder.

(2) Preparation of a photosensitive flexographic resin plate

A flexographic resin plate faithful to a negative film was obtained as generally described in Example 1 (3)

with the exception that the resin particles obtained the above (1) was employed instead of the resin particles of Example 1 (1). The properties of the obtained flexographic resin plate are shown in Table 1.

EXAMPLE 4

(2) Preparation of resin particles

A one liter reaction vessel having a mixer, a condenser and a temperature controlling device was charged with 900 parts of isopropyl alcohol and heated to 50° C. in a nitrogen blanket. At 50° C., a mixture of 7 parts of styrene, 9 parts of methyl methacrylate, 9 parts of n-butyl acrylate, 3 parts of 2-hydroxyethyl methacrylate, 2 parts of acrylamide and 20 parts of ethylene glycol dimethacrylate was added dropwise and mixed for 10 minutes, and 1 g of azobisisobutylonitrile was added and heated to 70° C. to continue reaction for 4 hours.

The precipitated white resin was filtered and rinsed three times with isopropyl alcohol and vacuum-dried to form a resin particles powder. The particle size of the primary particles was 1.3 micron by SEM observation.

10.8 parts of isophoronediisocyanate and a dispersion containing 50 parts of the resin particles powder and 500 parts of xylol were mixed in a one liter reaction vessel to which 0.1 part of dibutyltin dilaurate was added, and heated to 80° C. at which the reaction vessel was maintained for three hours. Then, 28.9 parts of Placcel FA-4 (2-hydroxyethyl acrylate modified with four molecules of epsilon-caprolactone, available from Daicel Chemical Co. Ltd.) and 0.1 part of hydroquinone were added at 80° C. over one hour and reacted for three hours to form a dispersion of reactive resin particles. The completion of the reaction was identified by disappear of an absorption of IR 2260 cm$^{-1}$ which is brought about from —NCO.

The dispersion was vacuum dried to obtain the reactive resin particles powder.

(2) Preparation of a photosensitive flexographic resin plate

A flexographic resin plate faithful to a negative film was obtained as generally described in Example 1 (3) with the exception that the resin particles obtained the above (1) was employed instead of the resin particles of Example 1 (1). The properties of the obtained flexographic resin plate are shown in Table 1.

EXAMPLE 5

(1) Preparation of resin particles

Resin particles were prepared in the same manner described in Example 2 (1).

(2) Preparation of a photosensitive flexographic resin plate

Sixty five parts of a copolymer having a transition temperature (Tg) of −55° C. (the copolymer was prepared from 20% of methyl methacrylate, 6% of methacrylic acid, 70% of butadiene and 4% of divinylbenzene), 8 parts of dimethylaminoethyl acrylate, 8 parts of phenoxyethanol, 8.5 parts of polypropylene glycol monomethacrylate, 8.5 parts of polyethylene glycol dimethacrylate, 1.6 parts of 2,2-dimethoxy-2-phenylacetophenone, 0.4 parts of 2,6-di-tertbutyl-p-cresol, and 5 parts of the resin particles prepared in the above (1) were mixed by a press kneader. The obtained mixture was calendered on an iron plate having 0.18 mm at about 80° C. in a thickness of 0.5 mm to form a transparent photosensitive resin plate.

A negative film was vacuum attached to the surface of the photosensitive resin plate and exposed with a chemical lamp (350 W) for one minute at a distance of 6 cm. After removing the negative film, the plate was brushed by a nylon brush in water of about 40° C. to obtain a flexographic resin plate having a relief image faithful to the negative film. The properties of the flexographic resin plate are shown in Table 1.

COMPARATIVE EXAMPLE 1

The flexographic resin plate was prepared as generally described in Example 1 (3) with the exception that the resin particles were not employed. The properties of the printing plate are shown in Table 1.

COMPARATIVE EXAMPLE 2

The flexographic resin plate was prepared as generally described in Example 1 (3) with the exception that Glass fiber Rev-1 available from Nippon Glass Fiber Company) was employed instead of the resin particles of Example 1 (2).

COMPARATIVE EXAMPLE 3

The flexographic resin plate was prepared as generally described in Example 5 (2) with the exception that the resin particles were not employed. The properties of the resin plate are shown in Table 1.

TABLE 1

|  | Example | | | | | Comparative Example | | |
|---|---|---|---|---|---|---|---|---|
|  | 1 | 2 | 3 | 4 | 5 | 1 | 2 | 3 |
| JIS A hardness | 75° | 75° | 74° | 74° | 62° | 73° | 74° | 62° |
| Impact resilience % | 21 | 21 | 22 | 21 | 45 | 20 | 20 | 44 |
| Tensile strength (Kg/cm$^2$) | 35.9 | 40.0 | 37.8 | 41.0 | 25.0 | 32.0 | 36.0 | 19.0 |
| Elongation (%) | 70.0 | 72.9 | 72.1 | 79.6 | 82.0 | 68.3 | 68.7 | 78.0 |
| Abrasion[1] | Good | Good | Good | Good | Good | Bad | Good | Bad |
| Plate quality[2] | Good | Good | Good | Good | Good | Bad | Bad | Good |

[1] A net point image of the flexographic resin plate is subjected to an abrasion treatment using a nylon brush 5,000 times in a flexographic resin ink and then "chipping" and "chopping" are observed in a convex portion. Good means that no "chipping" and "chopping" are observed and bad means that "chipping" or "chopping" is observed.
[2] The flexographic resin plate is checked with a test negative chart for a quality test of the printing plate. Good means that the checked plate has a good relief shoulder and bad means that the checked plate has a bad relief shoulder.

What is claimed is:

1. A photosensitive flexographic resin plate comprising a base plate and a photosensitive resin layer formed by applying thereon a resin composition which consists essentially of:
    (a) 20 to 95% by weight of a resin having rubber elasticity selected from a group consisting of butadiene polymer, isoprene polymer, chloroprene polymer, butadiene-styrene copolymer, polystyrene-polybutadiene-polystyrene block copolymer, polystyrene-polyisoprene-polystyrene block copolymer, butadiene-(meth)acrylic acid-acrylic ester copolymer, butadiene-(meth)acrylic acid-styrene copolymer and butadiene-(meth)acrylic acid-acrylonitrile copolymer,
    (b) 1 to 80% by weight of an unsaturated monomer,
    (c) 0.01 to 10% by weight of a photopolymerization initiator and
    (d) 0.1 to 50% by weight of resin particles having an average particle size of about 0.01 to 6 micron which are prepared by suspension or emulsion polymerization of an ethylenically unsaturated monomer and a monomer having at least two radical-polymerizable unsaturated groups, % being based on the amount of said resin composition;
    and said resin composition, when cured by exposure to ultraviolet beams, exhibiting a JIS A hardness of 30° to 80° and an impact resilience of at least 20%.

2. The photosensitive flexographic resin plate according to claim 1 wherein the resin particles have an average particle size of 0.05 to 0.50 micron.

3. The photosensitive flexographic resin plate according to claim 1 wherein the resin particles are present in an amount of 0.5 to 20% by weight based on the photosensitive resin composition.

4. The photosensitive flexographic resin plate according to claim 1 wherein the resin particles are made from a homopolymer or copolymer of a polymerizable ethylenically unsaturated monomer.

5. The photosensitive flexographic resin plate according to claim 1 wherein the resin particles are prepared by emulsion polymerization using as a dispersant an amphoteric compound.

6. The photosensitive flexographic resin plate according to claim 1 wherein the resin having rubber elasticity has a glass transition temperature (Tg) of not more than $-10°$ C.

7. The photosensitive flexographic printing plate according to claim 6 wherein the resin having rubber elasticity has a glass transition temperature of not more than $-30°$ C.

8. The photosensitive flexographic resin plate according to claim 1 wherein the base plate is a metal plate or a plastic plate.

* * * * *